(12) United States Patent
Reams

(10) Patent No.: US 9,852,744 B2
(45) Date of Patent: Dec. 26, 2017

(54) SYSTEM AND METHOD FOR DYNAMIC RECOVERY OF AUDIO DATA

(71) Applicant: Psyx Research, Inc., Irvine, CA (US)

(72) Inventor: Robert W. Reams, Mill Creek, WA (US)

(73) Assignee: PSYX RESEARCH, INC., Irvine, CA (US)

( * ) Notice: Subject to any disclaimer, the term of this patent is extended or adjusted under 35 U.S.C. 154(b) by 0 days.

(21) Appl. No.: 14/863,350

(22) Filed: Sep. 23, 2015

(65) Prior Publication Data

US 2016/0173995 A1 Jun. 16, 2016

Related U.S. Application Data

(60) Provisional application No. 62/092,603, filed on Dec. 16, 2014, provisional application No. 62/133,167, filed on Mar. 13, 2015, provisional application No. 62/156,061, filed on May 1, 2015, provisional application No. 62/156,065, filed on May 1, 2015.

(51) Int. Cl.
*H03G 3/00* (2006.01)
*G10L 21/034* (2013.01)
(Continued)

(52) U.S. Cl.
CPC .......... *G10L 21/034* (2013.01); *G10L 19/02* (2013.01); *G10L 19/028* (2013.01); *G10L 21/02* (2013.01);
(Continued)

(58) Field of Classification Search
CPC ... G10L 19/008; G10L 19/032; G10L 19/167; H04S 2400/03; H04S 3/008;
(Continued)

(56) References Cited

U.S. PATENT DOCUMENTS 4,922,537 A * 5/1990 Frederiksen .......... H03M 7/50
375/241
2003/0233234 A1 12/2003 Truman et al.
(Continued)

FOREIGN PATENT DOCUMENTS

WO 2010/003556 A1 1/2010

OTHER PUBLICATIONS

The Invitation to pay additional fees and, where applicable, protest fee issued by EPO dated Mar. 23, 2016 for International patent application No. PCT/US2015/065936.
Anonymous, "Dynamic range compression, Wikipedia, the free encyclopedia", 2003.
(Continued)

*Primary Examiner* — Alexander Jamal
(74) *Attorney, Agent, or Firm* — Jackson Walker LLP; Christopher J. Rourk; Thomas B. Hayes

(57) ABSTRACT

A system for processing audio data comprising a first system configured to receive an input audio data signal and to electronically process the input audio data signal to generate level normalized audio data. A second system configured to receive the level normalized audio data and to electronically process the level normalized audio data to generate a double sideband AM signal. A third system configured to receive the double sideband AM signal and to mix the double sideband AM signal with the input audio data to generate primary audio data frequency components having double sideband AM signal side components.

11 Claims, 3 Drawing Sheets

(51) Int. Cl.
| | |
|---|---|
| H04S 3/02 | (2006.01) |
| G10L 19/02 | (2013.01) |
| G10L 21/02 | (2013.01) |
| H04N 5/52 | (2006.01) |
| H04N 5/60 | (2006.01) |
| H04N 21/439 | (2011.01) |
| G10L 25/06 | (2013.01) |
| H04R 3/00 | (2006.01) |
| H04R 25/00 | (2006.01) |
| G10L 19/028 | (2013.01) |
| H04R 3/14 | (2006.01) |
| H03G 5/16 | (2006.01) |

(52) U.S. Cl.
CPC .......... G10L 21/0205 (2013.01); G10L 25/06 (2013.01); H04N 5/52 (2013.01); H04N 5/60 (2013.01); H04N 21/439 (2013.01); H04R 3/00 (2013.01); H04R 25/356 (2013.01); H04R 25/505 (2013.01); H04S 3/02 (2013.01); H03G 5/165 (2013.01); H04R 3/14 (2013.01); H04R 2225/43 (2013.01); H04R 2420/01 (2013.01)

(58) Field of Classification Search
CPC ....... H04S 2420/03; H04S 3/02; H03G 5/165; H04R 3/04
USPC ...... 381/107, 94.2, 20, 21, 22, 23, 317, 320; 704/501
See application file for complete search history.

(56) References Cited

U.S. PATENT DOCUMENTS

| | | |
|---|---|---|
| 2006/0217975 A1 | 9/2006 | Sung et al. |
| 2008/0049950 A1* | 2/2008 | Poletti ...................... H04R 3/00 381/94.2 |
| 2015/0243293 A1* | 8/2015 | Nagel ................... G10L 19/265 704/500 |

OTHER PUBLICATIONS

Anonymous, "Noise gates—Dynamics processors—Pro-Audio Basics", 2014.
The International Search report and Written Opinion issued by EPO dated May 31, 2016 for International patent application No. PCT/US2015/065936.
Ritchie, "MediaRenderer:1 Device Template Version 1.01", UPnP™ Forum, Jun. 25, 2002, pp. 1-12.
Ritchie, "MediaServer:1 Device Template Version 1.01", UPnP™ Forum, Jun. 25, 2002, pp. 1-12.
Kou et al., "RenderingControl:1 Service Template Version 1.01", UPnP™ Forum, Jun. 25, 2002, pp. 1-61.
Lawrence, "Basic:1.0 Device Definition Version 1.0", UPnP™ Forum, Dec. 12, 2002, pp. 1-7.
Stickler et al., "HVAC_System:1 Device Template", UPnP™ Forum, May 13, 2003, pp. 1-8.
"Universal Plug and Play Device Architecture", Jun. 8, 2000, ver. 1.0, pp. 1-54.
Miller et al., "UPnP Forum AV:4 Overview", UPnP™ Forum, 2012, pp. 1-45.
Ritchie et al., "UPnP AV Architecture:1", UPnP™ Forum, Jun. 25, 2002, pp. 1-22.
Buerl et al., "AVTransport:1 Service Template Version 1.01", UPnP™ Forum, Jun. 25, 2002, pp. 1-67.
Chan et al., "ConnectionManager:1 Service Template Version 1.01", UPnP™ Forum, Jun. 25, 2002, pp. 1-25.
Debique et al., "ContentDirectory:1 Service Template Version 1.01", UPnP™ Forum, Jun. 25, 2002, pp. 1-89.
The International Preliminary Report on Patentability issued by the International Bureau of WIPO dated Jun. 29, 2017 for International patent application No. PCT/US2015/065936.

* cited by examiner

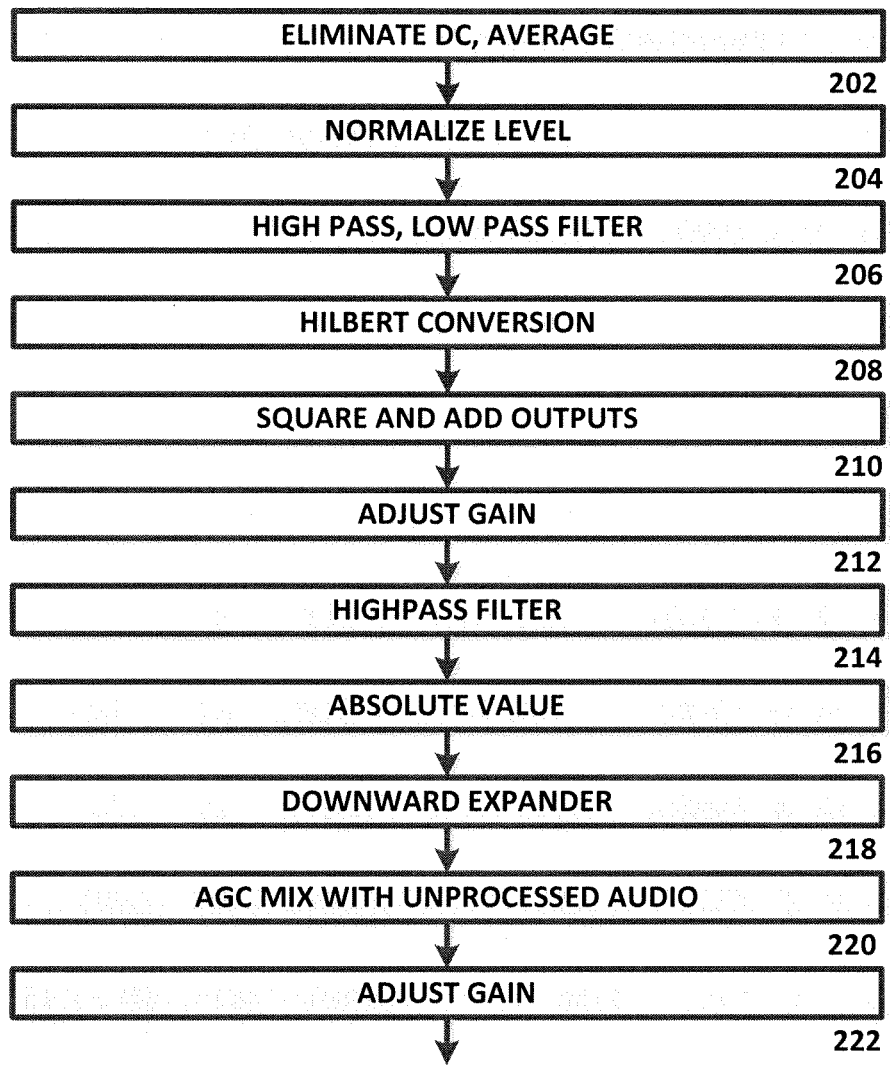

SYSTEM AND METHOD FOR DYNAMIC RECOVERY OF AUDIO DATA

RELATED APPLICATIONS

The present application claims priority to and benefit of U.S. Provisional Patent Application No. 62/092,603, filed on Dec. 16, 2014, U.S. Provisional Patent Application No. 62/133,167, filed on Mar. 13, 2015, U.S. Provisional Patent Application No. 62/156,061, filed on May 1, 2015, and U.S. Provisional Patent Application No. 62/156,065, filed on May 1, 2015, each of which are hereby incorporated by reference for all purposes as if set forth herein in their entirety.

TECHNICAL FIELD

The present disclosure relates generally to processing audio data, and more specifically to a system and method for the dynamic recovery of audio data that compensates for lossy compression and hearing loss.

BACKGROUND OF THE INVENTION

Hearing is a neurological process whereby small hairs called kinocilia in the organ of Corti receive vibratory stimuli and convert those stimuli into nerve impulses. Damage to the kinocilia can result in hearing loss.

SUMMARY OF THE INVENTION

A system for processing audio data comprising a first system configured to receive an input audio data signal and to electronically process the input audio data signal to generate level normalized audio data. A second system configured to receive the level normalized audio data and to electronically process the level normalized audio data to generate a double sideband AM signal. A third system configured to receive the double sideband AM signal and to mix the double sideband AM signal with the input audio data to generate primary audio data frequency components having double sideband AM signal side components.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
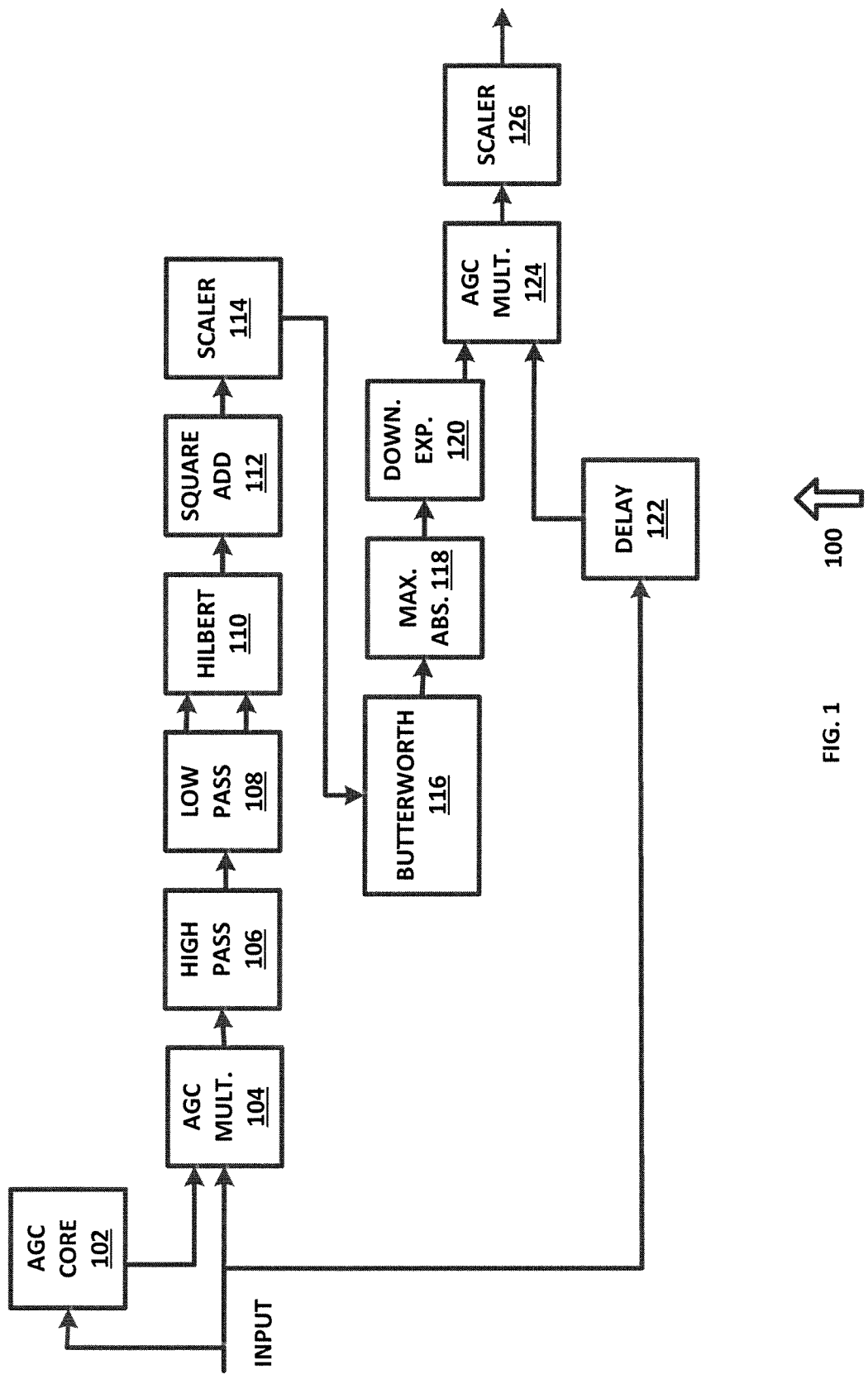
FIG. 1 is a diagram of a system for processing audio data to provide for dynamic recovery of audio data, in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

Lossy compression can be used to significantly reduce the amount of data required to transmit and store audio data, but the resulting decompressed audio data is typically sparse and has a narrow image "width," or apparent spread of sound when played from stereo speakers. For example, stereo audio data encoded with lossy compression techniques can result in decompressed data having fewer frequency components, which may be dropped during the lossy compression processing. This problem is further exacerbated because kinocilia and their associated nerve cells have an associated hysteresis, where the kinocilia are more sensitive to audio vibrations when they are active, but require a certain amount of energy to transition from a dormant state to an active state if they are allowed to become dormant. As a result, sparse audio data also causes kinocilia to behave non-optimally, because it allows kinocilia to become dormant during audio playback, which impairs the listening experience.

In addition, as a person ages, their kinocilia and the associated nerve cells in the organ of Corti can be damaged or inoperative, which can result in a loss of hearing at the frequencies represented by those kinocilia. As a result, when a person with hearing loss listens to the sparse frequency components of audio data from a lossy compressed source, they not only experience a decrease in quality due to kinocilia dormancy, they also experience a decrease in quality due to the absence of certain frequencies in their audio response.

As such, the present disclosure seeks to address poor audio quality from lossy compression sources by generating double side band frequency components for such audio data at a level that is at least 13 dB below the magnitude of the associated audio frequency components. The 13 dB level is important because that is the level at which the audio data is no longer able to be directly sensed by the listener, but it still has an effect on the kinocilia in the organ of Corti, and prevents them from becoming dormant. The double side band frequency components serve two purposes. The first purpose is to maintain the kinocilia in an active state, and thus allow the user to perceive audio signals that would otherwise be masked due to kinocilia dormancy. The second purpose is to stimulate the kinocilia on either side of a frequency "hole," as the effect on the listener of such stimulation is to simulate the stimulation of the missing kinocilia frequency. In other words, if the kinocilia for a person at the 1000 Hz frequency response have been damaged, such that the person can no longer hear 1000 Hz audio signals, then it is possible to simulate the stimulation of those kinocilia with double side band components to 1000 Hz, such as 999 Hz and 1001 Hz, 998 Hz and 1002 Hz, and so forth. In this manner, not only can a person hear the frequency components that would otherwise be inaudible, but the ability to discriminate direction, distance and other complex auditory responses (the "cocktail party" effect) can be restored. As such, the present disclosure can be implemented in hearing aids and other devices to help restore "20-20" hearing.

FIG. 1 is a diagram of a system 100 for processing audio data to provide for dynamic recovery of audio data, in accordance with an exemplary embodiment of the present disclosure. System 100 can be implemented in hardware or a suitable combination of hardware and software.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

System 100 includes AGC core 102, which receives an audio input signal INPUT and which processes the audio to remove a DC signal component, such as to maintain the audio input signal at an average level. In one exemplary embodiment, the audio input signal can be averaged over 200 mS period or other suitable periods.

AGC multiplier 104 receives the unprocessed audio input signal and the output of AGC core 102 and generates a normalized audio output signal.

High pass filter 106 and low pass filter 108 are used to form a band pass filter over a range that is generally too large to accommodate a single band pass filter element, such as with a lower frequency cutoff of about 100 to 130 Hz, for example 118 Hz, and a higher frequency cutoff of 10,000 to 11,000 Hz, for example 10400 Hz, or other suitable frequency ranges.

Hilbert converter 110 converts the filtered audio data to Hilbert space, by shifting one channel input 90 degrees from the other, to form a Bedrosian all pass pair. When signals are at 90 degrees to each other, they are orthogonal and decorrelated. The output of Hilbert converter 110 is provided to square add 112, to yield an instantaneous magnitude envelope detector. Scaler 114 is used to provide gain control to the output of square add 112.

Butterworth filter 116 is a second order high pass filter that is used to remove low frequency components that do not have as much of an effect on audio quality. For example, for frequency components below 1200 Hz, only the phase is significant for the "cocktail party" effect and other hearing processes that are used to improve audio quality, whereas above 1200 Hz, the envelope and magnitude of the signal is more important. Maximum absolute value detector 118 is used to generate the maximum absolute value of the signal.

Downward expander 120 is used to generate a double sideband suppressed AM signal. The release time (also shown as decay time or persistence) changes spread of side bands, and a suitable release time can be used, such as 3 milliseconds or less, although a suitable setting in the range of 1 millisecond to 8 milliseconds can be used. A short attack can be used, such as 0.01 milliseconds. Increasing the signal to noise ratio can be used to increase the height of the side band, where a setting of 1.06 to 1.09 can be used. The release time (decay time/persistence) changes spread of side bands.

The double sideband suppressed AM signal is used to stimulate kinociliac recruitment, which can be used when there is a hole or frequency gap in the frequency response of the Cochlea. By stimulating the kinocilia on either side of frequency gap, the frequency response of the damaged kinocilia can be simulated to the listener. Furthermore, when the sideband signals are present at 13 dB below the primary audio signal, the simulated signal is not audible over the primary audio signal.

The use of downward expander 120 in this manner also helps to improve the audio quality of audio that is generated using lossy compression, which increases spectrum sparcity. When there are less frequency components in content, the image width narrows, and the kinocilia are also understimulated, which can result in the active kinocilia becoming dormant. When that occurs, additional audio energy must be provided to activate the dormant kinocilia.

AGC multiplier 124 is used to combine the double sideband suppressed AM signal with the original audio signal, which is delayed by delay 122 to equal the time required for processing in the upper chain. Scaler 126 is used to provide gain control to the processed audio data.

In operation, system 100 provides dynamic recovery of audio data to improve the audio quality of audio data that is generated from stored or transmitted audio data that resulted from lossy compression processes. The dynamic recovery of audio data generates a double sideband suppressed AM signal having a magnitude that is 13 dB lower than the associated primary audio signal components, which can both improve the image width and audio quality of the audio data as well as simulate the stimulation of missing frequencies of kinocilia for listeners with hearing loss. In this manner, system 100 can not only improve audio quality for persons without hearing loss, but can also improve audio quality for persons with such hearing loss.

Figure 2:
FIG. 2 is a diagram of an algorithm for processing audio data to provide for dynamic recovery of audio data, in accordance with an exemplary embodiment of the present disclosure.

FIG. 2 is a diagram of an algorithm 200 for processing audio data to provide for dynamic recovery of audio data, in accordance with an exemplary embodiment of the present disclosure. Algorithm 200 can be implemented in hardware or a suitable combination of hardware and software.

Algorithm 200 begins at 202, where an input audio signal is processed to remove DC signal components, such as by averaging the signal over 200 milliseconds and then processing with an automatic gain control processor, or in other suitable manners. The algorithm then proceeds to 204.

At 204, the audio signal is level normalized, such as by multiplying the DC-compensated audio data with the unprocessed audio data in an automatic gain control processor or in other suitable manners. The algorithm then proceeds to 206.

At 206, the normalized audio signal is band pass filtered, such as by using a separate low pass filter and high pass filter or in other suitable manners. The algorithm then proceeds to 208.

At 208, the audio signal is processed using a Hilbert converter, such as to shift a left channel signal relative to a right channel signal by 90 degrees, to de-correlate the channels of audio data, or in other suitable manners. The algorithm then proceeds to 210.

At 210, the outputs from the Hilbert converter are squared and added, such as to generate an instantaneous magnitude envelope detector or for other suitable purposes. The algorithm then proceeds to 212.

At 212, the gain of the envelop signal is adjusted. The algorithm then proceeds to 214.

At 214, the processed audio signal is filtered using a high pass filter to remove audio components that are not susceptible to improvement using dynamic recovery, such as audio signal components having a frequency below 1000 to 1200 Hz. The algorithm then proceeds to 216.

At 216, the absolute value of the audio signal is generated. The algorithm then proceeds to 218.

At 218, the absolute value is processed using a downward expander to generate a double sideband suppressed AM signal having a magnitude that is 13 dB lower than the associated primary audio signal components. The algorithm then proceeds to 220.

At 220, the double sideband suppressed AM signal is mixed with a delayed corresponding input audio signal to generate audio data with improved quality. The algorithm then proceeds to 222.

At 222, the gain of the audio data is adjusted, and the processed audio is output.

In operation, algorithm 200 is used to generate audio data that includes dynamically-recover audio components, to improve the quality of the audio data. In one exemplary embodiment, algorithm 200 can be used to improve audio quality for audio data that is generated from lossy-compression output (where the number of frequency components in the audio data is lower than normal), by generating double sideband suppressed AM signal components adjacent to the primary frequency components, but where the double sideband suppressed AM signal has a magnitude of at least 13 dB lower than the primary signal. In this manner, the double sideband suppressed AM signals are not audible to the listener, but provide sufficient energy to the kinocilia to keep them stimulated, so as to reduce the amount of energy required to activate them. In another exemplary embodiment, the double sideband suppressed AM signal can aid a listener with hearing loss resulting from loss of kinocilia by simulating the stimulation of the missing frequency bands through stimulation of the adjacent frequency components.

Figure 3:
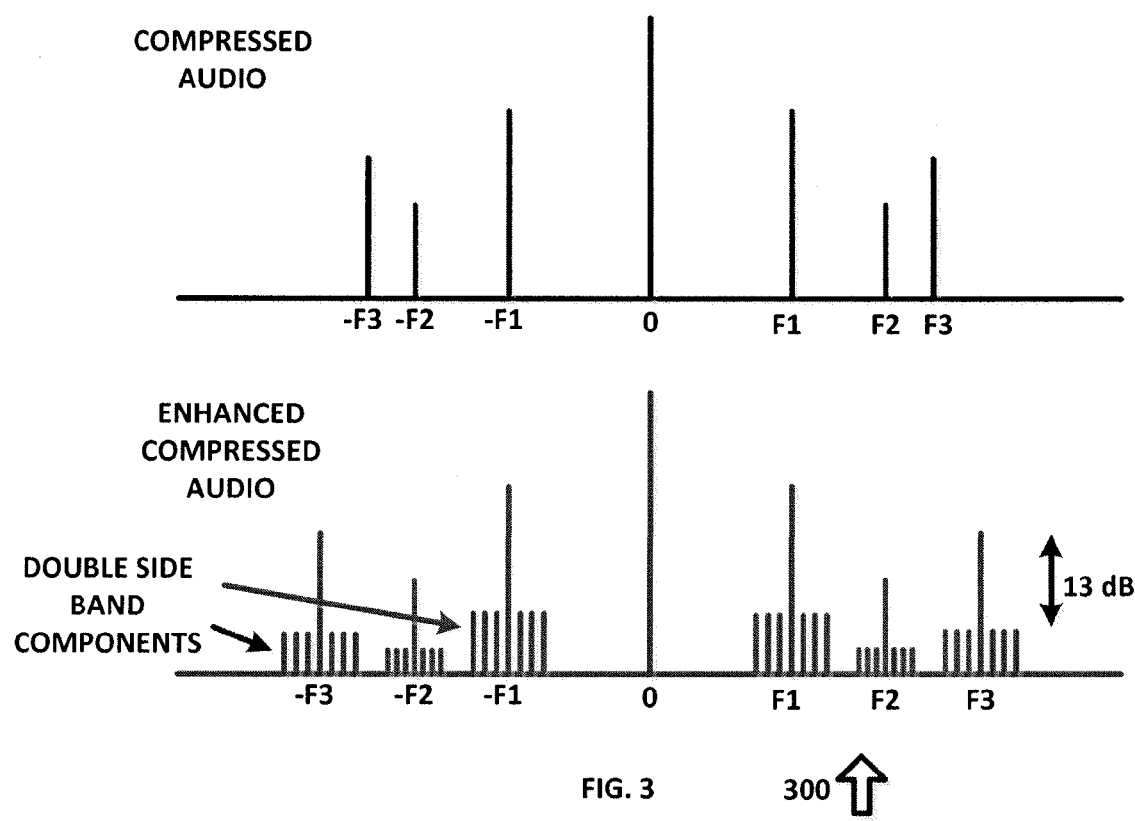
FIG. 3 is a frequency diagram showing the effect of double sideband AM components on sparse audio data, in accordance with the present disclosure.

FIG. 3 is a frequency diagram 300 showing the effect of double sideband AM components on audio data generated from lossy compressed audio data, in accordance with an exemplary embodiment of the present disclosure. Frequency diagram 300 shows a frequency distribution for audio data with frequency components at +/−F1, F2 and F3. These frequency components are relatively sparse, such as may result from audio data that has been compressed using lossy compression techniques. Frequency diagram 300 also shows a frequency distribution for audio data with dynamic recovery, having frequency components centered at +/−F1, F2 and F3 and associated double sideband AM components in a range around the centered frequency components. Although the double sideband AM components are represented as having an essentially flat profile, a Gaussian distribution, an exponential decay or any suitable profile can also or alternatively be used. The magnitude of the double sideband AM components is also at least 13 dB below the signal magnitude, in order to mask the double sideband AM components from perception by the user.

Typically, double sideband AM components are avoided. However, the present disclosure recognizes that kinocilia require a certain level of stimulation to remain in an active state, and otherwise will go into a dormant state, until a threshold level of audio energy causes them to switch from the dormant state to the active state. By generating double sideband AM components, the kinocilia can be stimulated to remain in the active state, even if the audio signals are masked by being more than 13 dB in magnitude relative to a major frequency component. The use of double sideband AM components in this manner enhances the audio listening experience, because the kinocilia remain active and can detect frequency components of the compressed audio data that would otherwise not have sufficient energy to switch them out of the dormant state.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for processing audio data comprising:
   a first system configured to receive an input audio data signal and to electronically process the input audio data signal to generate level normalized audio data;
   a second system configured to receive the level normalized audio data and to electronically process the level normalized audio data to generate a double sideband AM signal; and
   a third system configured to receive the double sideband AM signal and to mix the double sideband AM signal with the input audio data to generate primary audio data frequency components having double sideband AM signal side components
   wherein the first system comprises a first automatic gain control processor configured to receive the input audio data signal to remove a DC component of the input audio data signal;
   wherein the first system comprises a second automatic gain control processor coupled to the first automatic gain control processor and configured to receive the DC-compensated audio data signal and the input audio data signal and to generate the level normalized audio data;
   wherein the first system comprises a high pass filter coupled to the second automatic gain control processor and configured to receive the level normalized audio data and to generate high-pass filtered level normalized audio data;
   wherein the first system comprises a low pass filter coupled to the high pass filter and configured to receive the high-pass filtered level normalized audio data and to generate band-pass filtered normalized audio data;
   wherein the first system comprises a Hilbert transform coupled the low pass filter and to a square-add processor, the Hilbert transform configured to receive the band pass filtered normalized audio data and to form a Bedrosian all pass pair, the square-add processor configured to yield an instantaneous magnitude envelope detector.

2. The system of claim 1 wherein the second system comprises a Hilbert converter coupled to a low-pass filter and configured to receive the level normalized audio data and to electronically process the level normalized audio data to decorrelate the level normalized audio data.

3. The system of claim 1 wherein the second system comprises a downward expander coupled to a maximum absolute value detector and configured to receive the level normalized audio data and to generate the double sideband AM signal from the level normalized audio data.

4. The system of claim 1 wherein the first system comprises a Butterworth filter coupled to the square-add processor and configured to remove low frequency components.

5. A method for processing audio data comprising:
 receiving an input audio data signal at a first system and electronically processing the input audio data signal to generate level normalized audio data;
 receiving the level normalized audio data at a second system configured to and electronically processing the level normalized audio data to generate a double sideband AM signal; and
 receiving the double sideband AM signal at a third system and mixing the double sideband AM signal with the input audio data to generate primary audio data frequency components having double sideband AM signal side components and
 receiving the level normalized audio data at an input of a Hilbert converter that is coupled to a low pass filter and electronically processing the level normalized audio data to decorrelate the level normalized audio data at an output of the Hilbert converter that is coupled to a square-add processor.

6. The method of claim 5 further comprising removing a DC component of the input audio data signal using a first automatic gain control processor coupled to a second automatic gain control processor.

7. The method of claim 6 further comprising receiving the DC-compensated audio data signal and the input audio data signal at a second automatic gain control processor and generating the level normalized audio data.

8. The method of claim 5 further comprising receiving the level normalized audio data at a downward expander that is coupled to an automatic gain control multiplier and generating the double sideband AM signal from the level normalized audio data.

9. The method of claim 7 further comprising receiving the level normalized audio data at an input of a high pass filter coupled to the second automatic gain control processor and generating high-pass filtered level normalized audio data for output to a low pass filter.

10. The method of claim 9 further comprising receiving the high-pass filtered level normalized audio data at a low pass filter coupled to the high pass filter and generating band-pass filtered normalized audio data.

11. The method of claim 10 further comprising receiving the band pass filtered normalized audio data at a Hilbert converter processor having one or more control settings configured to operate the Hilbert converter processor as a Bedrosian all pass pair.

\* \* \* \* \*